United States Patent
Merilo et al.

(10) Patent No.: US 8,178,394 B2
(45) Date of Patent: *May 15, 2012

(54) QUAD FLAT PACK IN QUAD FLAT PACK INTEGRATED CIRCUIT PACKAGE SYSTEM AND METHOD FOR MANUFACTURING THEREOF

(75) Inventors: Dioscoro A. Merilo, Singapore (SG); Antonio B. Dimaano, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 30 days.

This patent is subject to a terminal disclaimer.

(21) Appl. No.: 12/827,864

(22) Filed: Jun. 30, 2010

(65) Prior Publication Data

US 2010/0264528 A1 Oct. 21, 2010

Related U.S. Application Data

(63) Continuation of application No. 12/236,437, filed on Sep. 23, 2008, now Pat. No. 7,777,320.

(51) Int. Cl.
*H01L 21/44* (2006.01)
*H01L 23/02* (2006.01)

(52) U.S. Cl. ....... 438/122; 438/108; 438/109; 438/124; 438/126; 438/127; 257/675; 257/685; 257/706

(58) Field of Classification Search .......... 438/107–112, 438/123–127, 122; 257/675, 676, 685, 686, 257/706, 707
See application file for complete search history.

(56) References Cited

U.S. PATENT DOCUMENTS

| | | | |
|---|---|---|---|
| 6,781,243 B1* | 8/2004 | Li et al. | 257/777 |
| 6,815,255 B2 | 11/2004 | Nakaoka et al. | |
| 6,960,823 B2 | 11/2005 | Miyaki et al. | |
| 7,227,253 B2 | 6/2007 | Tsai et al. | |
| 7,598,606 B2* | 10/2009 | Chow et al. | 257/686 |
| 7,777,320 B2* | 8/2010 | Merilo et al. | 257/685 |
| 7,923,846 B2* | 4/2011 | Do et al. | 257/777 |
| 2006/0197207 A1 | 9/2006 | Chow et al. | |
| 2009/0127680 A1 | 5/2009 | Do et al. | |

* cited by examiner

*Primary Examiner* — Kevin M Picardat
(74) *Attorney, Agent, or Firm* — Ishimaru & Associates LLP; Mikio Ishimaru; Stanley Chang

(57) ABSTRACT

A method for manufacturing an integrated circuit package system includes: providing a base package having a first integrated circuit with an inner lead on a periphery thereof and connected thereto with interconnects, and the inner lead partially encapsulated by an inner encapsulation; mounting an outer lead on the periphery of the base package; mounting a second integrated circuit above the base package and connected to the outer lead with the interconnects; and partially encapsulating, the base package and the outer leads with an outer encapsulation leaving a bottom surface of the inner lead and a bottom surface of the outer lead exposed.

18 Claims, 8 Drawing Sheets

QUAD FLAT PACK IN QUAD FLAT PACK INTEGRATED CIRCUIT PACKAGE SYSTEM AND METHOD FOR MANUFACTURING THEREOF

CROSS-REFERENCE TO RELATED APPLICATION(S)

This is a continuation of U.S. patent application Ser. No. 12/236,437 filed Sep. 23, 2008, now U.S. Pat. No. 7,777,320.

TECHNICAL FIELD

The present invention relates generally to integrated circuits and more particularly to a system for utilizing a quad flat pack in a quad flat pack for a package in package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: providing a base package having a first integrated circuit with an inner lead on a periphery thereof and connected thereto with interconnects, and the inner lead partially encapsulated by an inner encapsulation; mounting an outer lead on the periphery of the base package; mounting a second integrated circuit above the base package and connected to the outer lead with the interconnects; and partially encapsulating, the base package and the outer leads with an outer encapsulation leaving a bottom surface of the inner lead and a bottom surface of the outer lead exposed.

The present invention provides an integrated circuit package system including: a base package having a first integrated circuit with an inner lead on a periphery thereof and connected thereto with interconnects, and the inner lead partially encapsulated by an inner encapsulation; an outer lead mounted on the periphery of the base package; a second integrated circuit mounted above the base package and connected to the outer lead with the interconnects; and an outer encapsulation partially encapsulating, the base package and the outer lead with leaving a bottom surface of the inner lead and a bottom surface of the outer lead exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
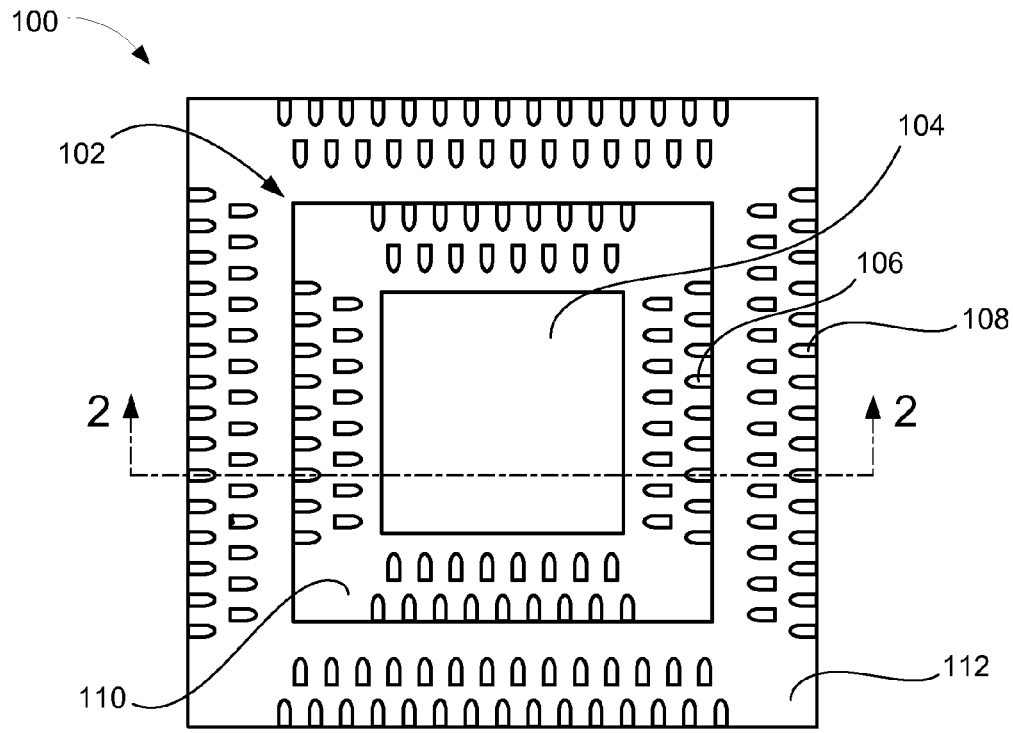
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a bottom view of an integrated circuit package system 100 in a first embodiment of the present invention. The integrated circuit package system 100 is shown having a base package 102 such as a quad flat pack with no leads (QFN).

The base package 102 has a die-pad 104. The base package 102 has inner leads 106 on the periphery of the die-pad 104. On the periphery of the base package 102, outer leads 108 are mounted.

The inner leads 106 and the die-pad 104 are partially encapsulated by an inner encapsulation 110. The base package 102 along with the outer leads 108 are further partially encapsulated by an outer encapsulation 112.

Figure 2:
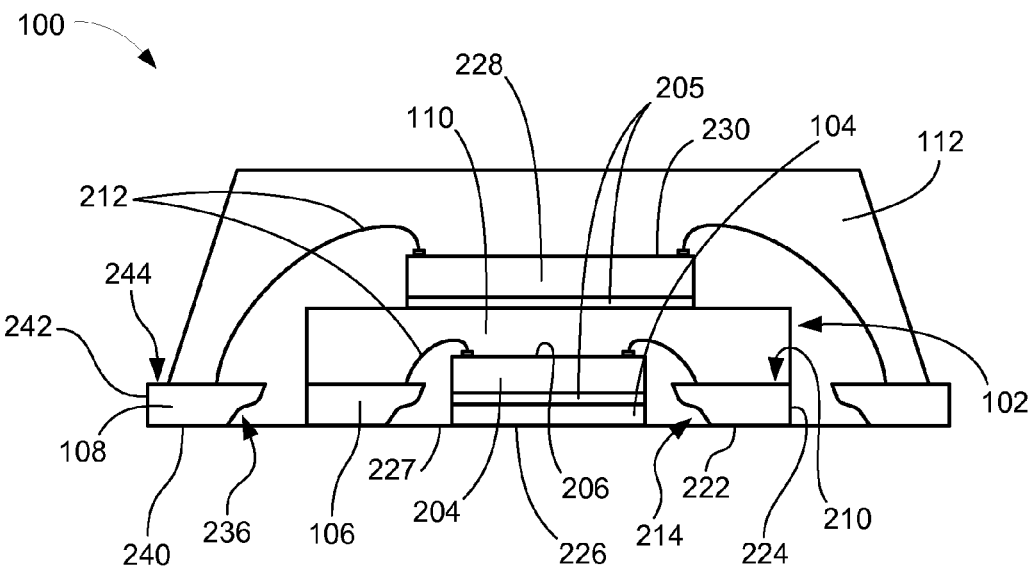
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having the base package 102 containing a first integrated circuit 204, such as a wire-bonded die, with an active side 206.

The first integrated circuit 204 is attached to the die-pad 104 with die attach adhesive 205. The inner leads 106 surround the periphery of the first integrated circuit 204. The inner leads 106 have a top portion 210.

The active side 206 of the first integrated circuit 204 is connected to the top portion 210 of the inner leads 106 with an interconnect such as bond wires 212. The inner leads 106 have a half-etched portion 214, providing mechanical attachment to the inner encapsulation 110. The bond wires 212 are fully encapsulated by an inner encapsulation 110 such as an epoxy mould compound.

The inner leads 106, and the die pad 104 are partially encapsulated by the inner encapsulation 110 leaving a bottom surface 222 and a side surface 224 of the inner leads 106 exposed and leaving a bottom surface 226 of the die pad 104 from the inner encapsulation 110.

The inner leads 106 on the periphery of the first integrated circuit 204 is further defined as the bottom surface 222 of the inner leads 106 coplanar with a bottom surface 227 of the inner encapsulation 110.

It has been discovered that utilizing the base package 102 increases the effectiveness of using known good components by using components that have advanced states of assembly such as the first integrated circuit 204, connected to the inner leads 106 by the bond wires 212 and encapsulated with the inner encapsulation 110. This contributes to improved end of line yields, reduced production waste, and reduced production costs.

Above the base package 102, a second integrated circuit 228 such as a wire-bonded die with an active side 230 is mounted. The second integrated circuit 228 is attached to the base package 102 with the die attach adhesive 205.

The outer leads 108 surround the periphery of the base package 102. The outer leads 108 are connected to the active side 230 of the second integrated circuit 228 with the bond wires 212. The outer leads 108 have a half-etched portion 236, which provide mechanical attachment to the outer encapsulation 112 such as a film assisted molding.

It has been further discovered that the utilization of the outer leads 108 in a quad flat pack with no lead (QFN) configuration along with the base package 102 in a QFN configuration provides an increase of lead density thus contributing to smaller form factors with higher rates of input/output (I/O) data transmission.

The outer encapsulation 112 fully encapsulates the second integrated circuit 228 and partially encapsulates the base package 102 leaving the bottom surface 222 of the inner leads 106 exposed. The outer encapsulation 112 also partially encapsulates the outer leads 108 leaving a bottom surface 240, a side surface 242, and a portion of a top surface 244 exposed.

The outer leads 108 on the periphery of the base package 102 is further defined as the bottom surface 240 of the outer leads 108 coplanar with a bottom surface 227 of the inner encapsulation 110.

Figure 3:
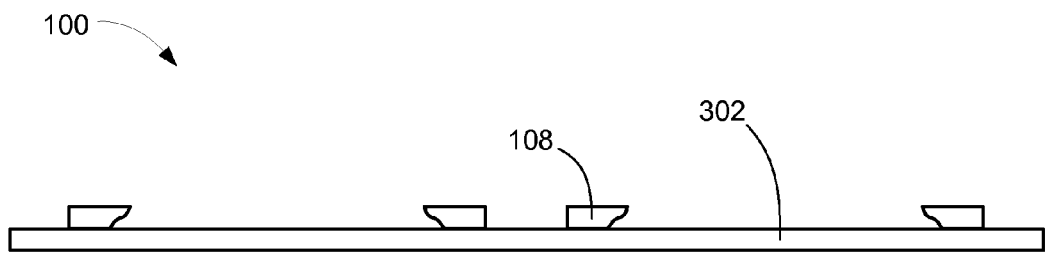
FIG. 3 is the integrated circuit package system of FIG. 2 in an outer tape/lead-frame phase of manufacture.

Referring now to FIG. 3, therein is shown the integrated circuit package system 100 of FIG. 2 in an outer tape/lead-frame phase of manufacture. The integrated circuit package system 100 is shown having a process tape 302 with the outer leads 108 mounted above. The outer leads 108 are provided as a lead frame and without providing a die-pad.

Figure 4:
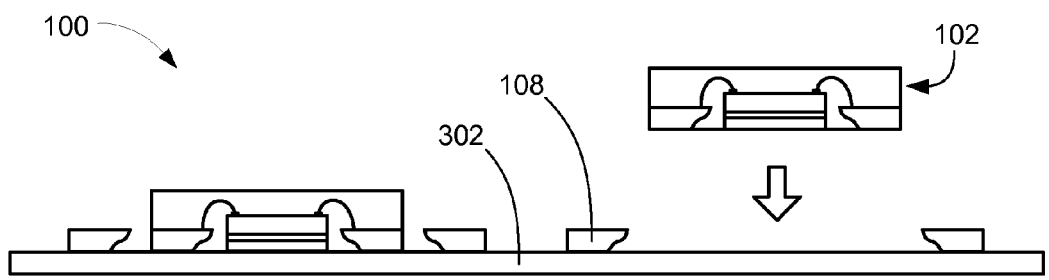
FIG. 4 is the integrated circuit package system of FIG. 3 in a package mount phase of manufacture.

Referring now to FIG. 4, therein is shown the integrated circuit package system 100 of FIG. 3 in a package mount phase of manufacture. The integrated circuit package system 100 is shown having the base package 102 mounted to the process tape 302 between the outer leads 108. The base package 102 is mounted in a known good state to increase the end of line yield.

Figure 5:
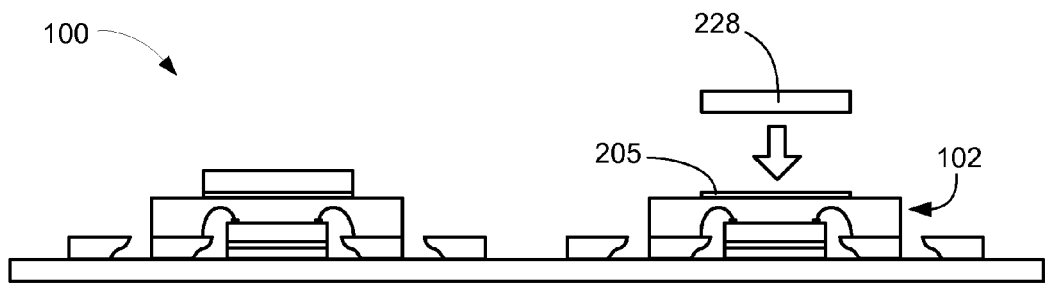
FIG. 5 is the integrated circuit package system of FIG. 4 in an integrated circuit mount phase of manufacture.

Referring now to FIG. 5, therein is shown the integrated circuit package system 100 of FIG. 4 in an integrated circuit mount phase of manufacture. The integrated circuit package system 100 is shown having the second integrated circuit 228 mounted above the base package 102 and attached with the die attach adhesive 205.

Figure 6:
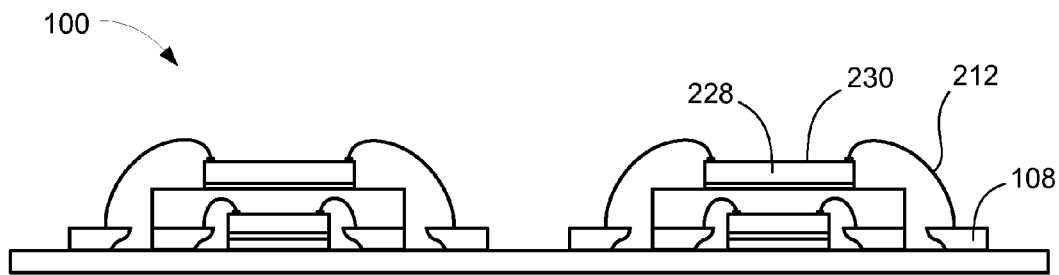
FIG. 6 is the integrated circuit package system of FIG. 5 after a wire-bonding phase of manufacture.

Referring now to FIG. 6, therein is shown the integrated circuit package system 100 of FIG. 5 after a wire-bonding phase of manufacture. The integrated circuit package system 100 is shown having the bond wires 212 connecting the active side 230 of the second integrated circuit 228 to the outer leads 108.

Figure 7:
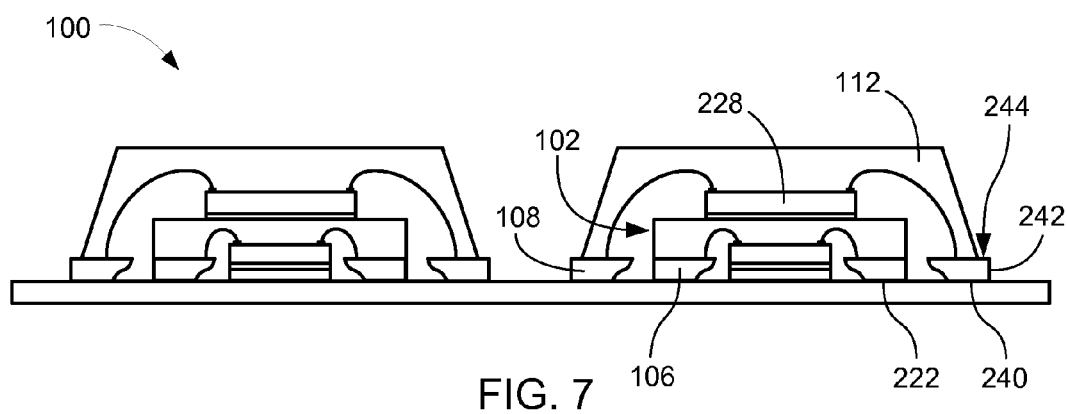
FIG. 7 is the integrated circuit package system of FIG. 6 after an encapsulation phase of manufacture.

Referring now to FIG. 7, therein is shown the integrated circuit package system 100 of FIG. 6 after an encapsulation phase of manufacture. The integrated circuit package system 100 is shown having the outer encapsulation 112 fully encapsulating the second integrated circuit 228 and partially encapsulates the base package 102 leaving the bottom surface 222 of the inner leads 106 exposed. The outer encapsulation 112 also partially encapsulates the outer leads 108 leaving the bottom surface 240, the side surface 242, and the portion of the top surface 244 exposed.

Figure 8:
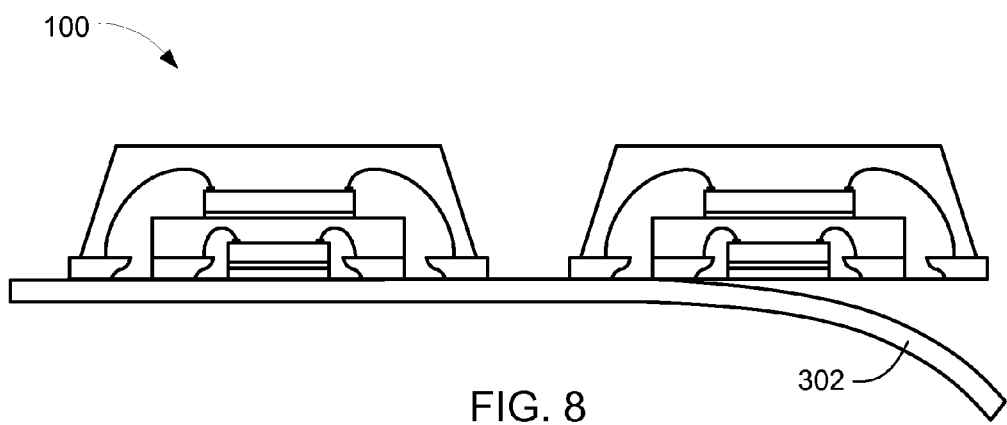
FIG. 8 is the integrated circuit package system of FIG. 7 in a detaping phase of manufacture.

Referring now to FIG. 8, therein is shown the integrated circuit package system 100 of FIG. 7 in a detaping phase of manufacture. The integrated circuit package system 100 is shown having the process tape 302 removed.

Figure 9:
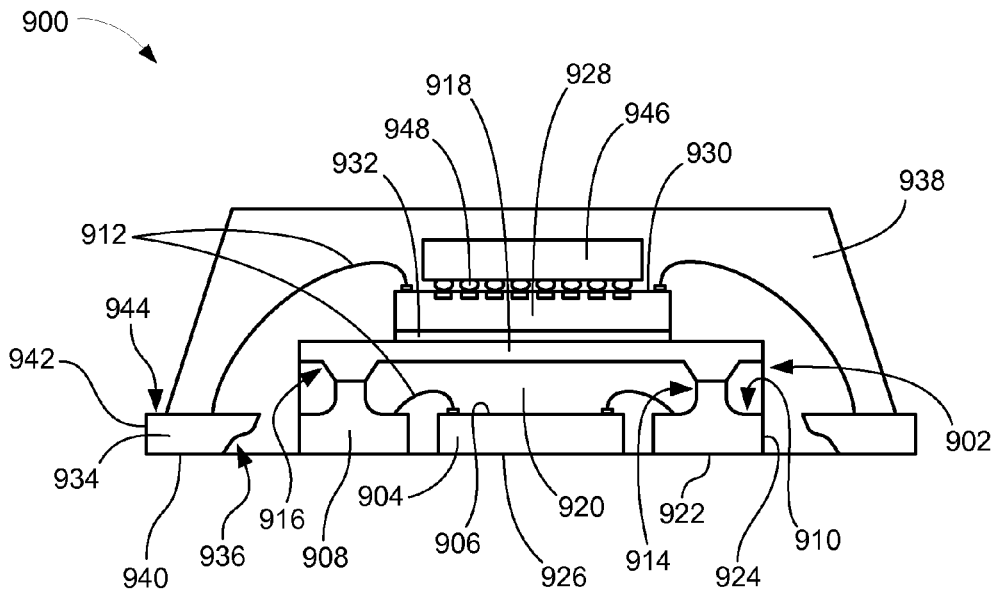
FIG. 9 is a cross-sectional view of an integrated circuit package system in a second embodiment of the present invention.

Referring now to FIG. 9, therein is shown a cross-sectional view of an integrated circuit package system 900 in a second embodiment of the present invention. The integrated circuit package system 900 is shown having a base package 902 such as a quad flat pack with no leads (QFN).

The base package 902 has a first integrated circuit 904, such as a wire-bonded die, with an active side 906. Inner leads 908 surround the periphery of the first integrated circuit 904. The inner leads 908 have a top portion 910.

The active side 906 of the first integrated circuit 904 is connected to the top portion 910 of the inner leads 908 with bond wires 912. The inner leads 908 have lead extensions 914, which extend upward from the top portion 910 of the inner leads 908.

The lead extensions 914 correspond to and contact heat sink supports 916. The heat sink supports 916 extend downward from a heat sink 918. The heat sink 918 is highly thermally conductive to dissipate heat generated by the first integrated circuit 904.

The heat sink 918 may also operate as an electromagnetic shield to absorb radiation that may interfere with the operation of the first integrated circuit 904. The heat sink 918 and the bond wires 912 are fully encapsulated by an inner encapsulation 920 such as an epoxy mould compound.

The inner leads 908, and the first integrated circuit 904 are partially encapsulated by the inner encapsulation 920 leaving a bottom surface 922 and a side surface 924 of the inner leads 908 exposed and leaving a bottom surface 926 of the first integrated circuit 904 exposed from the inner encapsulation 920.

Above the base package 902, a second integrated circuit 928 such as a wire-bonded die with an active side 930 is mounted. The second integrated circuit 928 is attached to the base package 902 with a die attach adhesive 932.

Outer leads 934 surround the periphery of the base package 902. The outer leads 934 are connected to the active side 930 of the second integrated circuit 928 with the bond wires 912. The outer leads 934 have a half-etched portion 936, which provide mechanical attachment to an outer encapsulation 938 such as a film assisted molding.

The outer encapsulation 938 fully encapsulates the second integrated circuit 928 and partially encapsulates the base package 902 leaving the bottom surface 922 of the inner leads 908 exposed.

The outer encapsulation 938 also partially encapsulates the outer leads 934 leaving a bottom surface 940, a side surface 942, and a portion of a top surface 944 exposed. Further, the outer encapsulation 938 fully encapsulates a third integrated circuit 946 mounted above the second integrated circuit 928.

The third integrated circuit 946 such as a flip-chip is connected to the second integrated circuit 928 with interconnects such as solder bumps 948.

Figure 10:
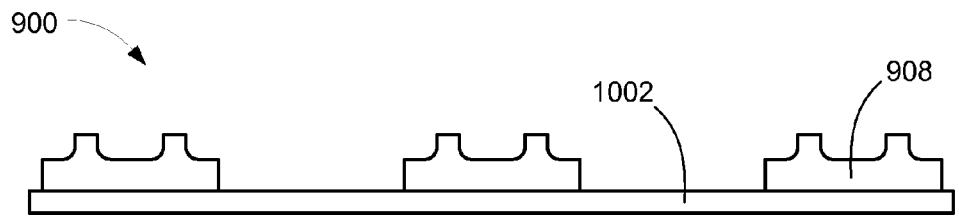
FIG. 10 is the integrated circuit package system of FIG. 9 in an inner tape/lead-frame phase of manufacture of a base package.

Referring now to FIG. 10, therein is shown the integrated circuit package system 900 of FIG. 9 in an inner tape/lead-frame phase of manufacture of a base package. The integrated circuit package system 900 is shown having the inner leads 908 mounted as part of a lead frame over a process tape 1002.

Figure 11:
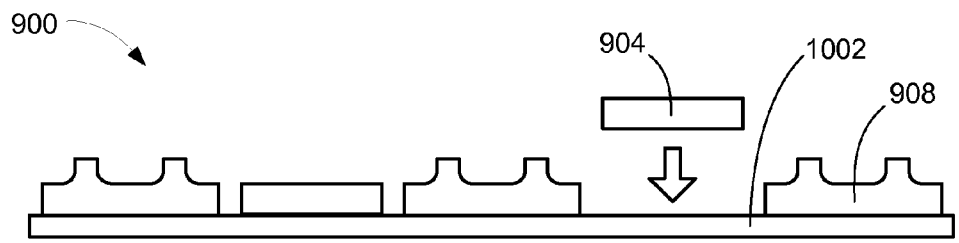
FIG. 11 is the integrated circuit package system of FIG. 10 in an integrated circuit mount phase of manufacture.

Referring now to FIG. 11, therein is shown the integrated circuit package system 900 of FIG. 10 in an integrated circuit mount phase of manufacture. The integrated circuit package system 900 is shown having the first integrated circuit 904 mounted between the inner leads 908 and above the process tape 1002.

Figure 12:
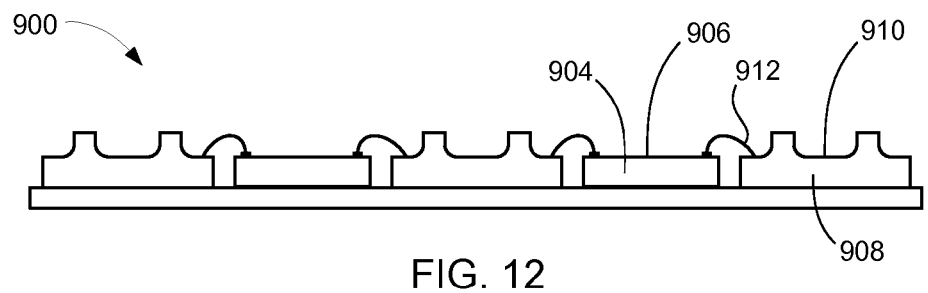
FIG. 12 is the integrated circuit package system of FIG. 11 after a wire-bonding phase of manufacture.
Figure 13:
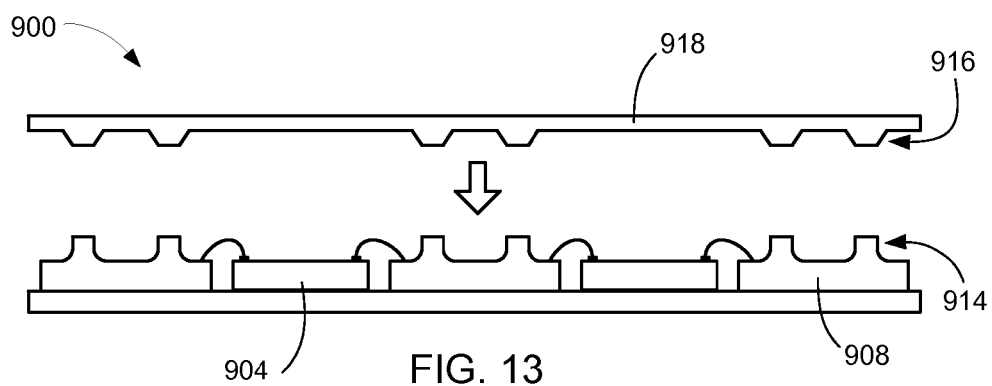
FIG. 13 is the integrated circuit package system of FIG. 12 in a heat sink attach phase of manufacture.

Referring now to FIG. 13, therein is shown the integrated circuit package system 900 of FIG. 12 in a heat sink attach phase of manufacture. The integrated circuit package system 900 is shown having the heat sink 918 with the heat sink supports 916 mounted above the first integrated circuit 904 and to the lead extensions 914 of the inner leads 908.

Figure 14:
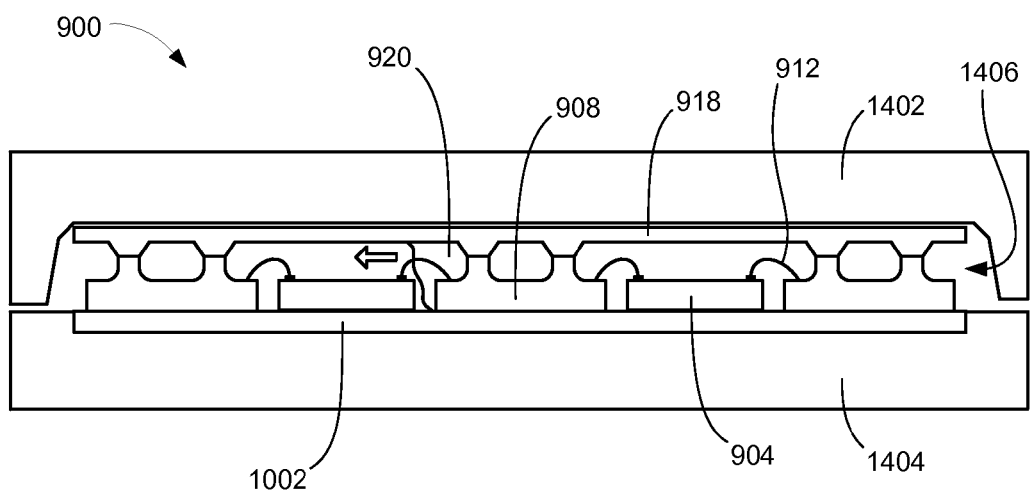
FIG. 14 is the integrated circuit package system of FIG. 13 in an encapsulation phase of manufacture.

Referring now to FIG. 14, therein is shown the integrated circuit package system 900 of FIG. 13 in an encapsulation phase of manufacture. The integrated circuit package system 900 is shown having a top chase 1402 and a bottom chase 1404 enclosing multiple base packages 1406 mounted to the process tape 1002. The inner encapsulation 920 is forced between the top chase 1402 and the bottom chase 1404 and in and around the first integrated circuit 904, the bond wires 912, the heat sink 918, and the inner leads 908.

Figure 15:
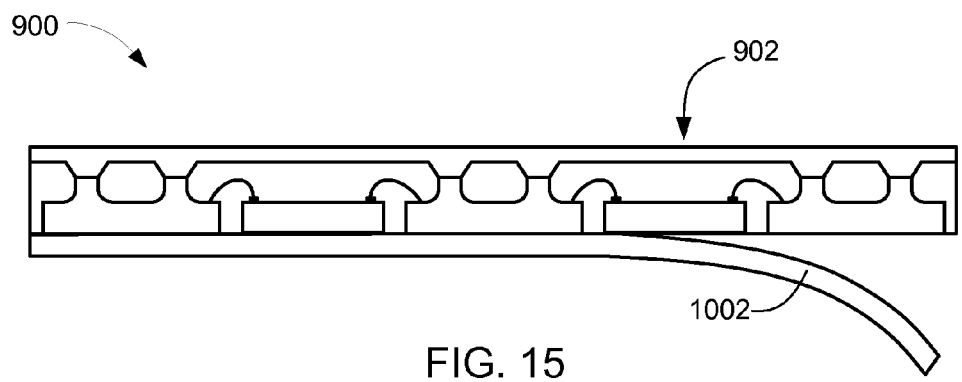
FIG. 15 is the integrated circuit package system of FIG. 14 in a detaping phase of manufacture.

Referring now to FIG. 15, therein is shown the integrated circuit package system 900 of FIG. 14 in a detaping phase of manufacture. The integrated circuit package system 900 is shown having the process tape 1002 removed from below the base package 902.

Figure 16:
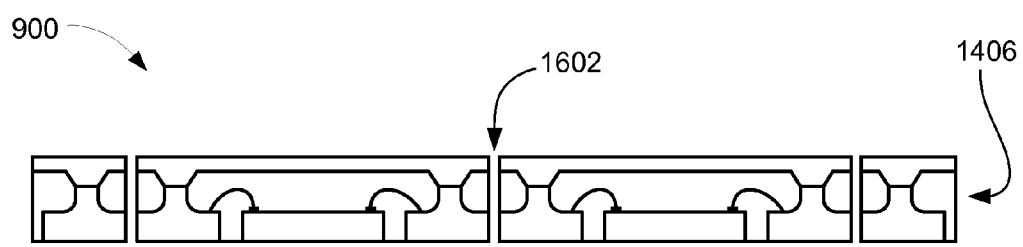
FIG. 16 is the integrated circuit package system of FIG. 15 after a singulation phase of manufacture.

Referring now to FIG. 16, therein is shown the integrated circuit package system 900 of FIG. 15 after a singulation phase of manufacture. The integrated circuit package system 900 is shown having singulation cuts 1602 dividing the multiple base packages 1406.

Figure 17:
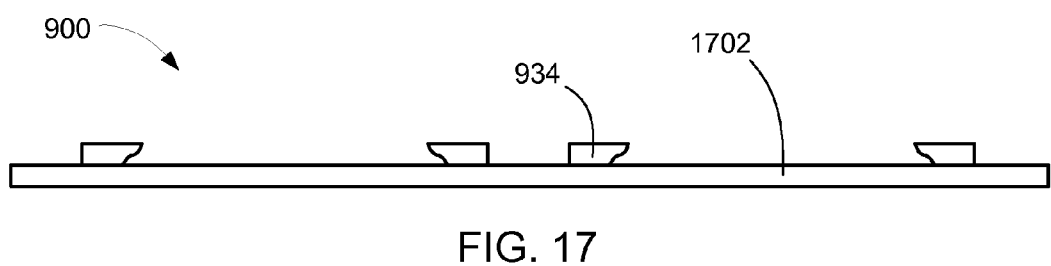
FIG. 17 is the integrated circuit package system of FIG. 9 in an outer tape/lead-frame phase of manufacture of a stacked package.

Referring now to FIG. 17, therein is shown the integrated circuit package system 900 of FIG. 9 in an outer tape/lead-frame phase of manufacture of a stacked package. The integrated circuit package system 900 is shown having a process tape 1702 with the outer leads 934 mounted above. The outer leads 934 are provided as a lead frame and without providing a die-pad.

Figure 18:
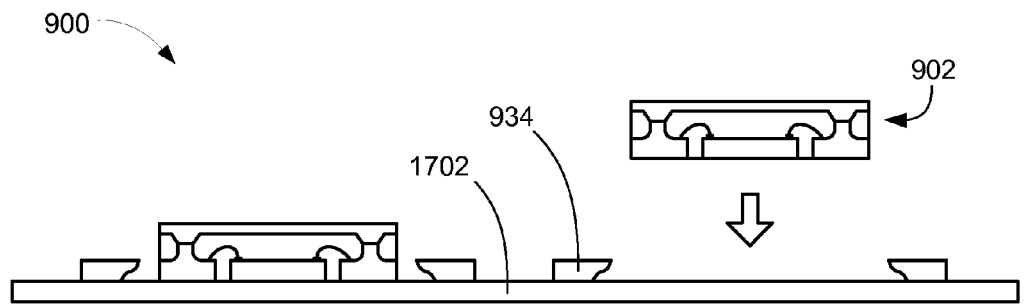
FIG. 18 is the integrated circuit package system of FIG. 17 in a package mount phase of manufacture.

Referring now to FIG. 18, therein is shown the integrated circuit package system 900 of FIG. 17 in a package mount phase of manufacture. The integrated circuit package system 900 is shown having the base package 902 mounted to the process tape 1702 between the outer leads 934. The base package 902 is mounted in a known good state to increase the end of line yield.

Figure 19:
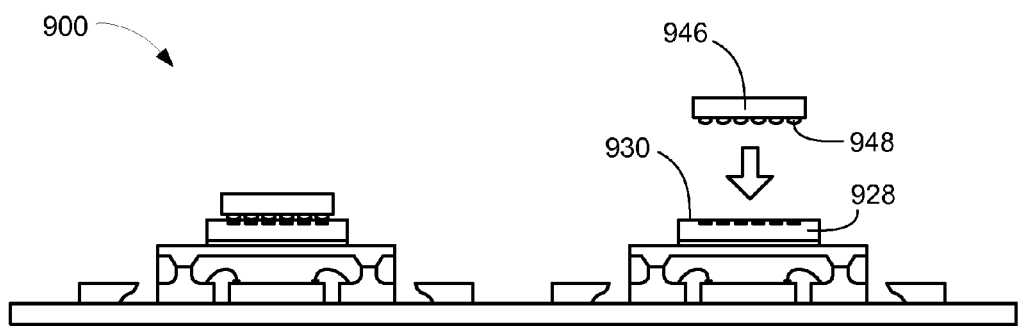
FIG. 19 is the integrated circuit package system of FIG. 18 in an integrated circuit mount phase of manufacture.

Referring now to FIG. 19, therein is shown the integrated circuit package system 900 of FIG. 18 in an integrated circuit mount phase of manufacture. The integrated circuit package system 900 is shown having the third integrated circuit 946 mounted above the second integrated circuit 928 and connected to the active side 930 with the solder bumps 948.

Figure 20:
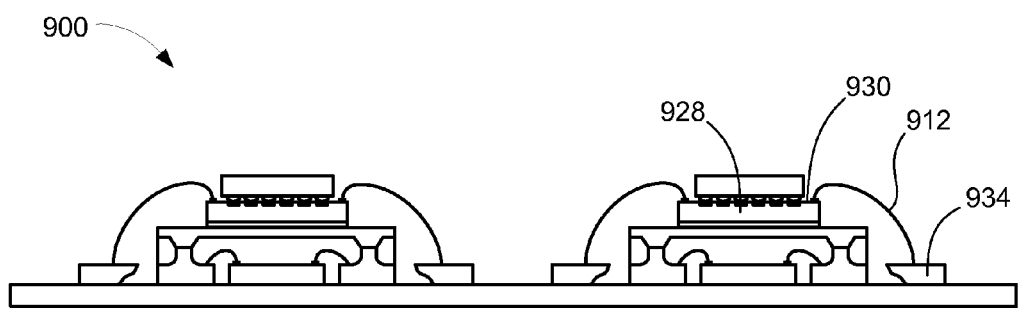
FIG. 20 is the integrated circuit package system of FIG. 19 after a wire-bonding phase of manufacture.

Referring now to FIG. 20, therein is shown the integrated circuit package system 900 of FIG. 19 after a wire-bonding phase of manufacture. The integrated circuit package system 900 is shown having the bond wires 912 connecting the active side 930 of the second integrated circuit 928 to the outer leads 934.

Figure 21:
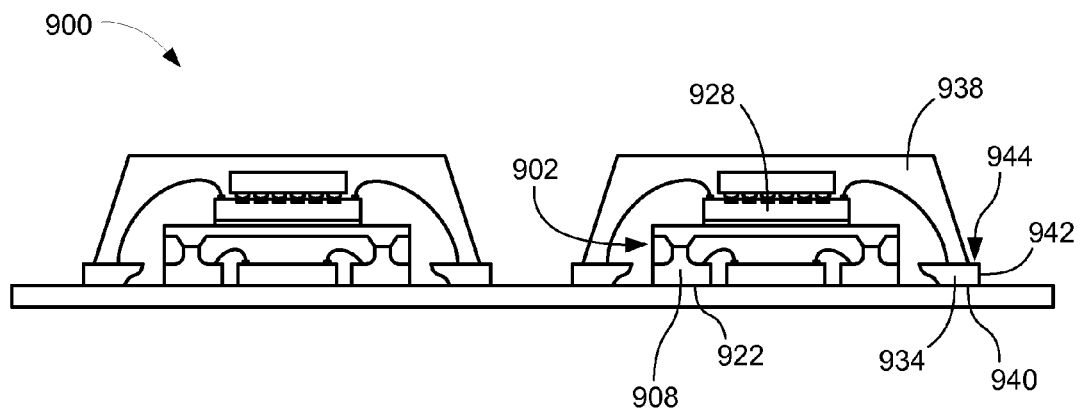
FIG. 21 is the integrated circuit package system of FIG. 20 after an encapsulation phase of manufacture.

Referring now to FIG. 21, therein is shown the integrated circuit package system 900 of FIG. 20 after an encapsulation phase of manufacture.

The integrated circuit package system 900 is shown having the outer encapsulation 938 fully encapsulating the second integrated circuit 928 and partially encapsulates the base package 902 leaving the bottom surface 922 of the inner leads 908 exposed.

The outer encapsulation also partially encapsulates the outer leads 934 leaving the bottom surface 940, the side surface 942, and the portion of the top surface 944 exposed.

Figure 22:
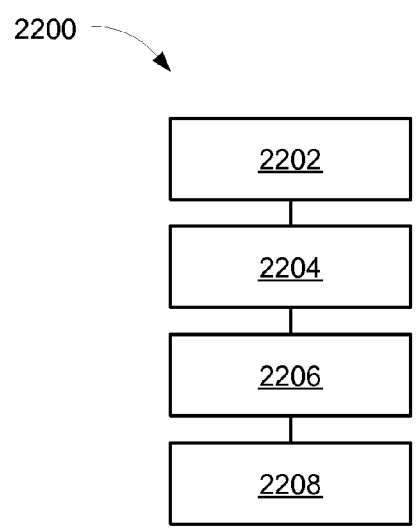
FIG. 22 is a flow chart of an integrated circuit package system for manufacturing the integrated circuit package system of FIG. 1 in an embodiment of the present invention.

Referring now to FIG. 22, therein is shown a flow chart of an integrated circuit package system 2200 for manufacturing the integrated circuit package system 100 of FIG. 1 in an embodiment of the present invention. The system 2200 includes providing a base package having a first integrated circuit with an inner lead on a periphery thereof and connected thereto with interconnects, and the inner lead partially encapsulated by an inner encapsulation in a block 2202; mounting an outer lead on the periphery of the base package in a block 2204; mounting a second integrated circuit above the base package and connected to the outer lead with the interconnects in a block 2206; and partially encapsulating, the base package and the outer leads with an outer encapsulation leaving a bottom surface of the inner lead and a bottom surface of the outer lead exposed in a block 2208.

Thus, it has been discovered that the quad flat pack in quad flat pack integrated circuit package system of the present invention furnishes important and heretofore unknown and unavailable solutions, capabilities, and functional aspects for package in package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a base package having a heat sink mounted above a first integrated circuit with an inner lead on a periphery thereof and connected thereto with interconnects, and the inner lead partially encapsulated by an inner encapsulation;
   mounting an outer lead on the periphery of the base package;
   mounting a second integrated circuit above the base package and connected to the outer lead with the interconnects; and
   partially encapsulating, the base package and the outer leads with an outer encapsulation leaving a bottom surface of the inner lead and a bottom surface of the outer lead exposed.

2. The method as claimed in claim 1 wherein:
   providing the base package includes providing the base package having the first integrated circuit above a die pad.

3. The method as claimed in claim 1 further comprising:
   etching the outer lead to form a half-etched portion.

4. The method as claimed in claim 1 further comprising:
   mounting a third integrated circuit above the second integrated circuit and connected thereto with a solder bump.

5. The method as claimed in claim 1 further comprising:
   providing a process tape and mounting the base package thereto.

6. A method for manufacturing an integrated circuit package system comprising:
   providing a base package having a first integrated circuit with an inner lead on a periphery thereof and connected thereto with bond wires, and the inner lead partially encapsulated by an inner encapsulation and further connected to a heat sink above the first integrated circuit;
   mounting an outer lead on the periphery of the base package;
   mounting a second integrated circuit above the base package and connected to the outer lead with the bond wires; and
   partially encapsulating, the base package and the outer leads with an outer encapsulation leaving a bottom surface of the inner lead and a bottom surface of the outer lead exposed.

7. The method as claimed in claim 6 wherein:
   providing the base package includes providing a heat sink support extending downward from the heat sink and a lead extension extending upward from the inner lead and connecting the heat sink the lead extension to the heat sink support.

8. The method as claimed in claim 6 wherein:
   mounting the second integrated circuit includes attaching the second integrated circuit with a die attach adhesive.

9. The method as claimed in claim 6 wherein:
encapsulating the outer lead partially with the outer encapsulation includes exposing a side portion and a portion of a top surface of the outer lead.

10. An integrated circuit package system comprising:
a base package having a heat sink mounted above a first integrated circuit with an inner lead on a periphery thereof and connected thereto with interconnects, and the inner lead partially encapsulated by an inner encapsulation;
an outer lead mounted on the periphery of the base package;
a second integrated circuit mounted above the base package and connected to the outer lead with the interconnects; and
an outer encapsulation partially encapsulating, the base package and the outer lead with leaving a bottom surface of the inner lead and a bottom surface of the outer lead exposed.

11. The system as claimed in claim 10 further comprising:
a die pad coupled to the first integrated circuit and the first integrated circuit is mounted above the die pad.

12. The system as claimed in claim 10 further comprising:
a half-etched portion in the outer lead.

13. The system as claimed in claim 10 further comprising:
a third integrated circuit mounted above the second integrated circuit; and
a solder bump connecting the third integrated circuit to the second integrated circuit.

14. The system as claimed in claim 10 further comprising:
a bottom surface of the inner encapsulation exposed from the outer encapsulation.

15. The system as claimed in claim 10 wherein:
the interconnects are bond wires.

16. The system as claimed in claim 15 further comprising:
a heat sink support extending downward from the heat sink; and
a lead extension extending upward from the inner lead and the heat sink support is connected to the lead extension.

17. The system as claimed in claim 15 further comprising:
a die attach adhesive attaching the second integrated circuit above the base package.

18. The system as claimed in claim 15 wherein:
the outer encapsulation partially encapsulates the outer lead exposing a side portion and a portion of a top surface of the outer lead.

* * * * *

UNITED STATES PATENT AND TRADEMARK OFFICE
CERTIFICATE OF CORRECTION

| | | |
|---|---|---|
| PATENT NO. | : 8,178,394 B2 | Page 1 of 1 |
| APPLICATION NO. | : 12/827864 | |
| DATED | : May 15, 2012 | |
| INVENTOR(S) | : Merilo et al. | |

It is certified that error appears in the above-identified patent and that said Letters Patent is hereby corrected as shown below:

Column 6, between lines 50 and 51, the following paragraph [0076] from the specification was omitted. Please insert the following:

--Referring now to FIG. 12, therein is shown the integrated circuit package system 900 of FIG. 11 after a wire-bonding phase of manufacture. The integrated circuit package system 900 is shown having the bond wires 912 connecting the active side 906 of the first integrated circuit 904 to the top portion 910 of the inner leads 908.--

Signed and Sealed this
Eighteenth Day of September, 2012

David J. Kappos
*Director of the United States Patent and Trademark Office*